United States Patent
Lim et al.

(10) Patent No.: US 12,279,528 B2
(45) Date of Patent: Apr. 15, 2025

(54) THERMOELECTRIC MATERIAL MANUFACTURING METHOD

(71) Applicant: LG ELECTRONICS INC., Seoul (KR)

(72) Inventors: Jongrae Lim, Seoul (KR); Jun Kim, Seoul (KR); Jooyoung Park, Seoul (KR); Jeonghun Son, Seoul (KR); Youngil Jang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 741 days.

(21) Appl. No.: 17/422,362

(22) PCT Filed: Jun. 12, 2019

(86) PCT No.: PCT/KR2019/007040
§ 371 (c)(1),
(2) Date: Jul. 12, 2021

(87) PCT Pub. No.: WO2020/149465
PCT Pub. Date: Jul. 23, 2020

(65) Prior Publication Data
US 2022/0077375 A1    Mar. 10, 2022

Related U.S. Application Data

(60) Provisional application No. 62/793,896, filed on Jan. 18, 2019.

(51) Int. Cl.
H01L 35/34    (2006.01)
B22F 3/105    (2006.01)
(Continued)

(52) U.S. Cl.
CPC ............. *H10N 10/01* (2023.02); *B22F 3/105* (2013.01); *B22F 3/20* (2013.01); *B22F 9/08* (2013.01);
(Continued)

(58) Field of Classification Search
CPC ............. B22F 3/105; B22F 3/20; B22F 9/08; H10N 10/01; H10N 10/852; H10N 10/857
See application file for complete search history.

(56) References Cited

U.S. PATENT DOCUMENTS

2011/0248210 A1   10/2011   Willigan et al.
2013/0284967 A1*   10/2013   Kim ...................... C01B 19/007
                                                        252/62.3 T (Continued)

FOREIGN PATENT DOCUMENTS

JP           2001250990 A   *   9/2001
KR   10-2013-0121450 A     11/2013
(Continued)

OTHER PUBLICATIONS

Investigation of the sintering pressure and thermal conductivity anisotropy of melt-spun spark plasma sintered (Bi, Sb)2Te3 thermoelectric materials (Year: 2011).*
IVacancy-induced dislocations within grains for high-performance PbSe thermoelectrics Zhiwei Chen (Year: 2017).*

*Primary Examiner* — Jenny R Wu
(74) *Attorney, Agent, or Firm* — Birch, Stewart, Kolasch & Birch, LLP

(57) ABSTRACT

The present invention relates to a thermoelectric material and, specifically, to a thermoelectric material manufacturing method for increasing potential density. The thermoelectric material manufacturing method of the present invention can comprise the steps of: preparing a bulk thermoelectric material by using thermoelectric material raw materials; preparing a powder of the bulk thermoelectric material;

(Continued)

adding, to the powder, a metal additive selected from the thermoelectric material raw materials; forming an intermediate in which the metal additive is dispersed in the thermoelectric material; and sintering same at at least the melting point temperature of the metal additive.

15 Claims, 13 Drawing Sheets

(51) Int. Cl.
| | | |
|---|---|---|
| *B22F 3/20* | (2006.01) | |
| *B22F 9/08* | (2006.01) | |
| *H01L 35/26* | (2006.01) | |
| *H10N 10/01* | (2023.01) | |
| *H10N 10/857* | (2023.01) | |
| *H10N 10/852* | (2023.01) | |

(52) U.S. Cl.
 CPC ......... *H10N 10/857* (2023.02); *H10N 10/852* (2023.02)

(56) References Cited

U.S. PATENT DOCUMENTS

| | | |
|---|---|---|
| 2017/0288114 A1 | 10/2017 | Katz et al. |
| 2018/0331272 A1 | 11/2018 | Kurosaki et al. |

FOREIGN PATENT DOCUMENTS

| | | |
|---|---|---|
| KR | 10-2015-0086627 A | 7/2015 |
| KR | 10-2019-0028944 A | 3/2019 |

* cited by examiner

100μm 1.00μm 0.5μm (a)  (b)

(a)

(b)

(a)

(b)

THERMOELECTRIC MATERIAL MANUFACTURING METHOD

CROSS REFERENCE TO RELATED APPLICATIONS

This application is the National Phase of PCT/KR2019/007040 filed on Jun. 12, 2019, which claims priority under 35 U.S.C. § 119(e) to U.S. Provisional Application No. 62/793,896 filed on Jan. 18, 2019, all of which are hereby expressly incorporated by reference into the present application.

FIELD

The present disclosure relates to a thermoelectric material, and more particularly, to a method for manufacturing a thermoelectric material capable of increasing dislocation density.

BACKGROUND ART

A thermoelectric effect refers to a reversible and direct energy conversion between heat and electricity. A thermoelectric phenomenon occurs by movements of charge carriers, i.e., electrons and holes in materials.

The Seebeck effect is a conversion of temperature differences directly into electricity, and is applied to the field of power generation using an electromotive force which is generated due to a difference in temperature between two ends of a thermoelectric material. The Peltier effect is a phenomenon in which heat is generated in an upper junction and absorbed in a lower junction when a current flows in a circuit, and is applied to a cooling field using a temperature difference between both ends, caused by a current applied from the outside. On the other hand, the Seebeck effect and the Peltier effect are different from Joule heating in that such effects are thermodynamically reversible but Joule heating is not thermodynamically reversible.

In recent years, thermoelectric materials have been applied to active cooling systems for semiconductor equipment and other electronic devices in which it is difficult to solve problems regarding production of heat in passive cooling systems, and demand for such thermoelectric materials has been expanded to fields in which the problems were not solved in the systems using a conventional refrigerant gas compression method, such as precision temperature control systems applied to DNA research.

Thermoelectric cooling is an environmentally friendly cooling technique which causes neither vibration nor noise and in which no refrigerant gases causing environmental issues are used. When cooling efficiency is improved through development of highly-efficient thermoelectric cooling materials, the thermoelectric cooling materials will expand to application fields of generation cooling systems such as commercial and household refrigerators, air conditioners, and the like.

When a thermoelectric material is applied to automotive engine units, facilities from which heat is released in industrial factories, etc., electricity may be generated due to a difference in temperature caused between both ends of the thermoelectric material. As a result, the thermoelectric material has drawn attention as one new and renewable energy source.

DISCLOSURE

Technical Problem

The present disclosure has been proposed for satisfying those needs, and is directed to providing a thermoelectric material capable of improving thermoelectric performance, and a method for manufacturing the same.

The technical problems to be solved in the present disclosure are not limited to those aspects mentioned above, and other technical problems not mentioned can be clearly understood by those skilled in the art, to which the present disclosure pertains, from the following description.

Technical Solution

In order to achieve the above aspects of the present disclosure, there is provided a method for manufacturing a thermoelectric material, which may include preparing a bulk thermoelectric material using thermoelectric material raw materials, producing a powder of the bulk thermoelectric material, adding a metal additive selected from the thermoelectric material raw materials to the powder, forming an intermediate in which the metal additive is dispersed in the thermoelectric material, and sintering the intermediate at a temperature higher than or equal to a melting point of the metal additive.

Here, the thermoelectric material may have a composition of Chemical Formula 1 below, $$(TI)_x(Bi0.5Sb1.5\text{-}xTe3\text{-}y)_{1-x} \qquad \text{<Chemical Formula 1>}$$

TI may denote a topological insulator.

The thermoelectric material may have a dual-phase structure including a first grain composed of the Bi0.5Sb1.5-xTe3-y material and a second grain composed of the topological insulator.

Also, the topological insulator may include at least one of AgSbTe2 and Ag2Te.

Also, in Chemical Formula 1, $0 < x \leq 0.4$ and $0 < y \leq 0.5$.

Here, the raw materials may include Ag, Bi, Sb, and Te.

The metal additive may be tellurium (Te).

The metal additive may be contained in an amount which is greater than 20% to smaller than 25% by weight of the raw materials.

Here, the forming the intermediate may be performed using a melting and rapid cooling device.

Also, the forming the intermediate may include charging the thermoelectric material powder and the metal additive into a tube having a nozzle, melting the thermoelectric material powder and the metal additive in a liquid state, and discharging the molten material to a rotating plate to form particles in a shape of a ribbon.

Here, the sintering may be performed by using spark plasma sintering.

Also, the sintering may be performed to form dislocations by eluting the metal additive to outside.

Here, the sintering may be performed by using exclusion-sintering.

Advantageous Effects

According to an embodiment of the present disclosure, a thermoelectric material with improved thermoelectric performance can be provided.

Specifically, an increase in electrical conductivity and a decrease in thermal conductivity can be achieved at the same time, which may result in obtaining a thermoelectric material having a greatly improved figure of merit (ZT).

In particular, in the case of preparing a bulk thermoelectric material using extrusion-sintering, a crystal orientation direction and a usage direction of the material may be the same, so that electrical conductivity can be increased to improve thermoelectric performance, which may provide an advantageous effect in terms of cost and production.

The effects obtained by the present disclosure are not limited to the effects mentioned above, and other effects not mentioned can be clearly understood by those skilled in the art from the following description.

BEST MODE FOR CARRYING OUT PREFERRED EMBODIMENTS

A composition of a thermoelectric material used around room temperature (300K) for cooling or heat pumps is generally represented by $(Bi_aSb_{1-a})_2(Te_cSe_{1-c})_3$, and a figure of merit (ZT) of a polycrystalline bulk material is about 1 at 300K. Performance of the thermoelectric material may be determined by a figure of merit (ZT) value as defined by Equation 1, which is generally referred to as a dimensionless figure of merit.

$$ZT = \frac{S^2 \sigma T}{k} \quad \text{[Equation 1]}$$

In Equation 1, S denotes a Seebeck coefficient (meaning thermoelectric power generated due to a temperature difference per 1° C.), σ denotes an electrical conductivity, T denotes an absolute temperature, and κ denotes a thermal conductivity. $S^2\sigma$ constitutes a power factor. As shown in Equation 1 above, in order to increase the figure of merit (ZT) of the thermoelectric material, the Seebeck coefficient S and the electrical conductivity σ, that is, the power factor $S^2\sigma$, should be increased and the thermal conductivity κ should be decreased.

However, the Seebeck coefficient and the electrical conductivity have a trade-off relationship with each other. Thus, one value increases when the other value decreases and vice versa depending on a change in concentration of electrons or holes as carriers. For example, a metal having high electrical conductivity has a low Seebeck coefficient, and an insulating material having a low electrical conductivity has a high Seebeck coefficient. The trade-off relationship between the Seebeck coefficient and the electrical conductivity restricts an increase in power factor.

Figure 1A:
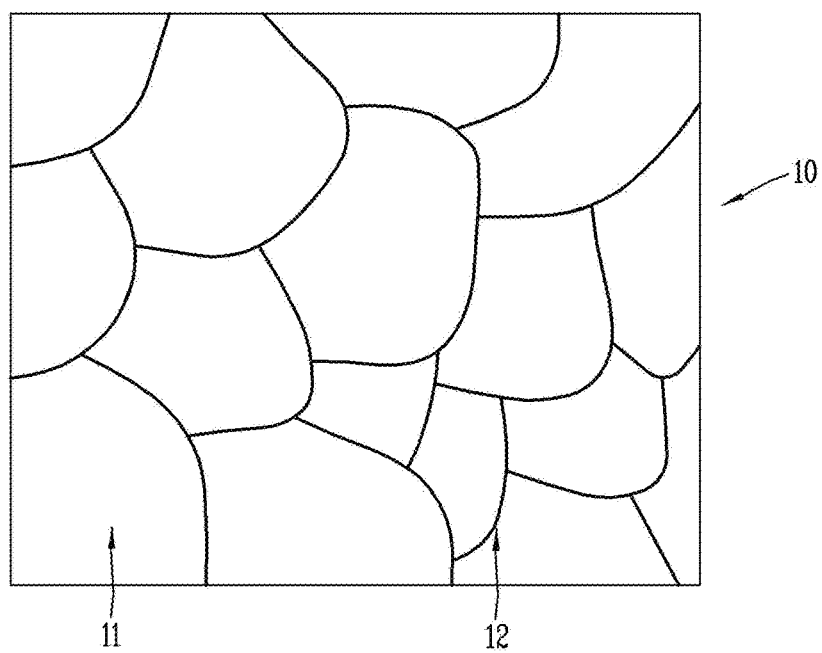
FIGS. 1A to 1C are diagrams illustrating microstructures of thermoelectric materials for improving figures of merit ZT of the thermoelectric material.
Figure 1B:
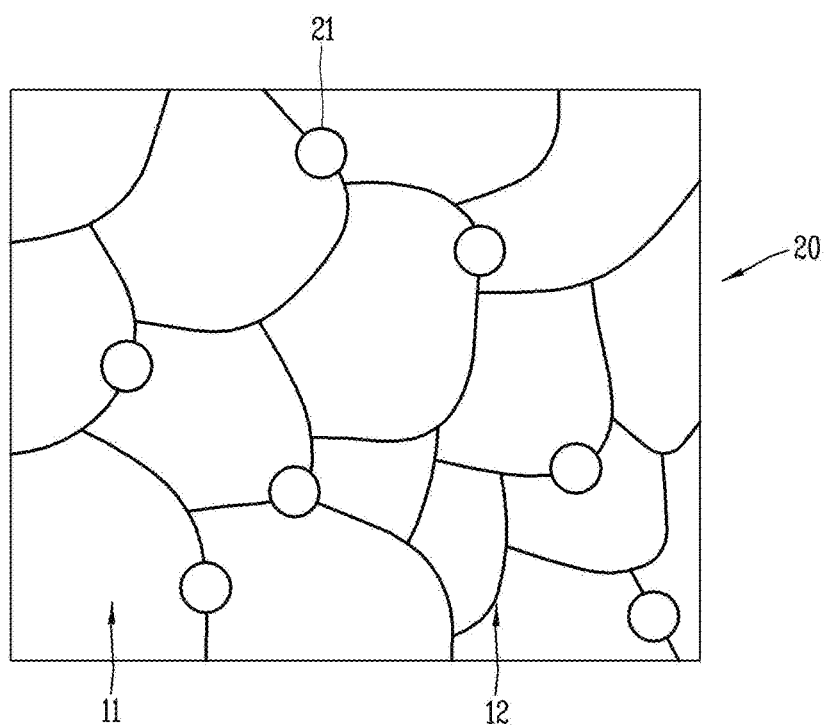
Figure 1C:
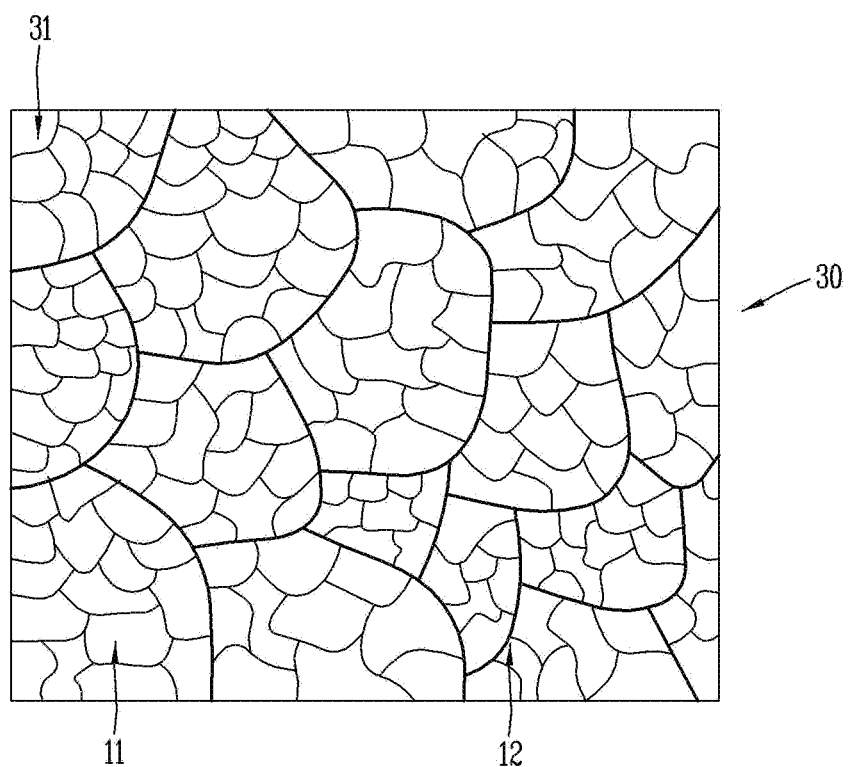

FIGS. 1A to 1C are views illustrating microstructures of thermoelectric materials applied to the present disclosure for improving figures of merit (ZT) of the thermoelectric materials.

In order to improve the figures of merit (ZT) of thermoelectric materials, there have been attempts to form nanostructures such as superlattice thin films, nanowires, and quantum dots, and the like to increase the Seebeck coefficient using a quantum confinement effect or decrease the thermal conductivity based on a Phonon Glass Electron Crystal (PGEC) concept.

First, the quantum confinement effect is a concept in which an increase in energy density of states (DOS) of carriers in a material is caused by nanostructures to increase an effective mass, resulting in increasing the Seebeck coefficient. In this case, an interrelation between the electrical conductivity and the Seebeck coefficient collapses, and thus the electrical conductivity does not significantly increase even when the Seebeck coefficient increases.

Second, the PGEC concept is a concept in which only the thermal conductivity is lowered without any decrease in electrical conductivity by blocking movements of phonons taking part in heat transfer and preventing movements of charge carrier electrons from being blocked. That is, among the phonons and the charge carrier electrons that transfer heat from a high-temperature side to low-temperature side of the thermoelectric material, only movement of the phonons is blocked by a barrier (phonon scattering), and the charge carrier electrons flows smoothly. Therefore, such a concept has an effect of lowering thermal conductivity due to phonon scattering, but has an effect of preventing electrical conductivity from being lowered due to the charge carrier electrons.

These techniques will be described in detail with reference to drawings of a microstructure of the thermoelectric material.

FIG. 1A is a diagram illustrating a microstructure of a nanocomposite thermoelectric material 10. In the nanocomposite thermoelectric material 10, a ZT value may be increased by reducing a size of a grain 11 of the thermoelectric material. The grain 11 may have a diameter of 20 to 100 nanometers (nm).

When the phonons pass through a grain boundary 12, the phonon scattering phenomenon may occur. Accordingly, thermal conductivity may be lowered with a decrease in size of the grain 11. On the other hand, since the movements of the charge carrier electrons are affected at a relatively low level when the phonons pass through the grain boundary 12, a change in electrical conductivity may be minimized. Therefore, as shown in FIG. 1A, the thermoelectric material having the nanocomposite structure can obtain the ZT value which is increased due to the PGEC concept.

FIG. 1B is a diagram illustrating a microstructure of an eluted thermoelectric material 20 having an increased ZT value through elution of a predetermined material 21 onto the grain boundary 12.

The material 21 eluted onto the grain boundary 12 may cause phonon scattering and simultaneously have an effect of improving electrical conductivity, thereby increasing the total ZT value of the eluted thermoelectric material 20.

FIG. 1C is a diagram illustrating a microstructure of a thermoelectric material 30 having a hierarchical structure obtained through a change in process.

The hierarchical structure serves to form another grain in the grain 11, and thus induces phonon scattering of larger phonons through the larger grain 11 and induced phonon scattering of smaller phonons through the smaller grain 31. Thermal conductivity of the thermoelectric material can be lowered by the thusly-induced phonon scattering.

According to the microstructures as described above, a structure for lowering the thermal conductivity is commonly brought into focus. As such, a method of changing only thermal conductivity to change the ZT value has a drawback in that a change in the ZT value may be merely slight.

As still another specific method to realize the PGEC concept, ZT is very significantly improved when a PbSeTe layer is formed on PbTe in a superlattice or $Bi_2Te_3$ and $Sb_2Te_3$ layers are stacked into a superlattice. However, a thin film process should be artificially used to form such a superlattice. This requires so expensive facilities. And, the thermoelectric materials are not suitable for actual use for thermoelectric power generation and cooling devices since the thin films have a thickness of several hundreds of nanometers even when the thin films are formed to a large thickness.

Therefore, a structure capable of improving electric conductivity and Seebeck coefficient as well as reducing thermal conductivity by means of nanostructures is proposed as the microstructure of the thermoelectric material proposed in one embodiment of the present disclosure.

One of major strategies for lowering thermal conductivity is to realize a microstructure capable of effectively scattering phonons taking part in heat transfer through nano-structurization, which may be the same as described with reference to FIG. 1A. The grain boundary 12 is an effective interface for phonon scattering. Therefore, a lattice thermal conductivity may be lowered when a particle size is reduced to increase a density of the grain boundary 12. Recently, a technique of preparing nano-sized thermoelectric material particles such as nanoparticles, nanowires, nanoplates, and the like has come to the fore as a strategy for developing such materials.

On the other hand, since the electrical conductivity and the Seebeck coefficient have the trade-off relationship as described above, it is difficult to improve both values at once. The trade-off relationship between the Seebeck coefficient and the electrical conductivity appears since it is difficult to simultaneously adjust physical properties such as Seebeck coefficient and electrical conductivity in a bulk sample. However, it is possible to break the trade-off relationship between the Seebeck coefficient and the electrical conductivity when a channel for realizing the Seebeck coefficient and the electrical conductivity may be divided into two channels. That is, the high Seebeck coefficient and electrical conductivity may be realized at the same time when the electrical conductivity is obtained from a sample surface and the Seebeck coefficient is given as a high value from a bulk material.

In one embodiment of the present disclosure, a topological insulator (hereinafter, referred to as "TI") may be used in order to realize high Seebeck coefficient and electrical conductivity at the same time.

The topological insulator refers to a material in which a bulk behaves as an insulator due to strong spin-orbital bonding and time reversal symmetry but a surface is a topologically protected metal. That is, it means that electrons can only move through the surface of the sample, and this phenomenon in which the sample surface of the insulator is metallic is referred to as a "Topological metallic state." Electrical conductivity of the thermoelectric material may be improved when the electrons move through a metal layer formed on the surface of the topological insulator. Hereinafter, a microstructure of a thermoelectric material in accordance with one embodiment of the present disclosure will be described in detail.

Figure 2:
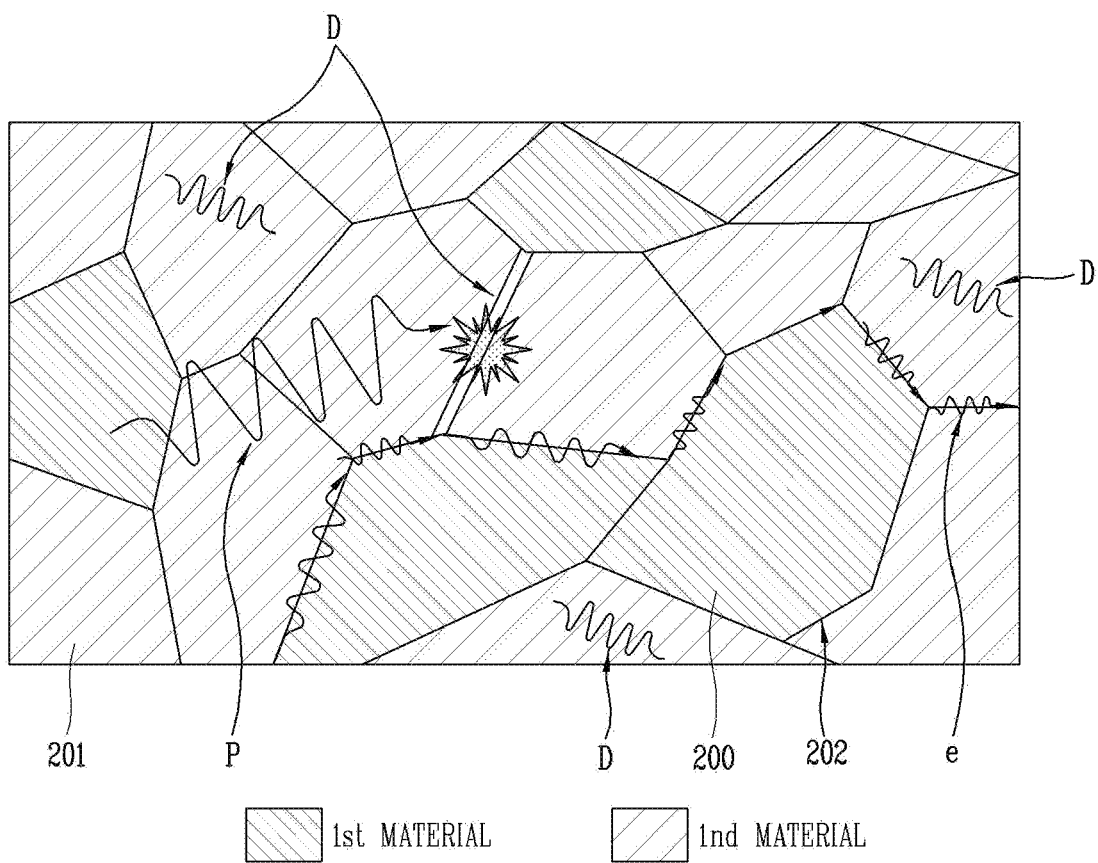
FIG. 2 is a schematic view illustrating a microstructure of a thermoelectric material having interfaces formed by different types of topological insulators according to one embodiment of the present disclosure.
Figure 3:
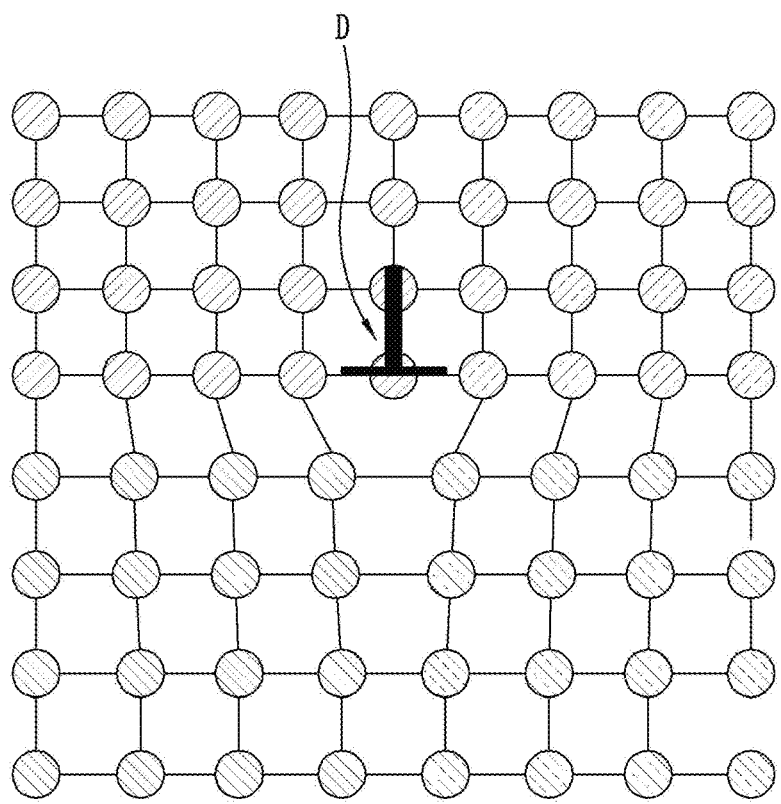
FIG. 3 is a conceptual view illustrating dislocations illustrated in FIG. 2.

FIG. 2 is a schematic view illustrating a microstructure of a thermoelectric material having interfaces formed by different types of topological insulators according to one embodiment of the present disclosure. Also, FIG. 3 is a conceptual view illustrating dislocations illustrated in FIG. 2.

A microstructure of a nanocomposite thermoelectric material illustrated in FIG. 2 may be produced through phase separation of a grain 200 (hereinafter, referred to as a first grain) of a first material and a grain 201 (hereinafter, referred to as a second grain) of a second material. A method for preparing a microstructure according to one embodiment of the present disclosure will be described later in detail.

At least one of the first material and the second material constituting the nanocomposite thermoelectric material according to one embodiment of the present disclosure may include, for example, at least one of Bi—Te-based, Pb—Te-based, Co—Sb-based, Si—Ge-based, and Fe—Si-based thermoelectric materials. The Pb—Te-based thermoelectric material may be a material containing both Pb and Te and may also contain another element. The Co—Sb-based thermoelectric material may be a material containing Sb and one element of Co and Fe. The Si—Ge-based thermoelectric material may be a material containing both Si and Ge. More specific example of the thermoelectric materials may include $Bi_{0.5}Sb_{1.5}Te_3$ alloy, $Bi_2Te_3$ alloy, $CsBi_4Te_6$, $CoSb_3$, PbTe alloy, $Zn_4Sb_3$, $Zn_4Sb_3$ alloy, $Na_xCoO_2$, $CeFe_{3.5}Co_{0.5}Sb_{12}$, $Bi_2Sr_2Co_2O_y$, $Ca_3Co_4O_9$, or $Si_{0.8}Ge_{0.2}$ alloy. However, the thermoelectric material may not be limited to these materials.

At least one of the first and second materials according to one embodiment of the present disclosure may include a topological insulator.

At least one of the first and second materials according to one embodiment of the present disclosure may include a semiconductor having a high energy gap.

The thermoelectric material according to one embodiment of the present disclosure may lead to a significant increase in ZT value in that each of thermal conductivity, electrical conductivity, and Seebeck coefficient can be controlled.

First, the thermoelectric material according to one embodiment of the present disclosure can reduce thermal conductivity by means of nanostructures. As described above in the microstructure of the nanocomposite shown in FIG. 1A, the nanostructures are effective in lowering thermal conductivity since phonon scattering may be induced at the grain boundary 12. The thermoelectric material according to one embodiment of the present disclosure may reduce thermal conductivity by means of the nanostructures formed of the respective first and second grains.

Second, the thermoelectric material according to one embodiment of the present disclosure may enhance electrical conductivity through a "topological metallic state" of the topological insulator. Since a metallic state having high mobility is formed at the grain boundary 12, which may also be referred to as a surface of the topological insulator, electrical conductivity of the thermoelectric material can be very highly enhanced.

Third, according to one embodiment of the present invention, Seebeck coefficient may be improved using a material having a high energy gap as a sample bulk. When the Seebeck coefficient is improved, a high power factor may be expected. Since the Seebeck coefficient increases with increase in the energy gaps of the first and second materials forming the first and second grains, respectively, the Seebeck coefficient may be increased when the first and second materials are formed of an insulator. This is because the insulator is a material having a high energy gap.

Fourth, in one embodiment of the present disclosure, dislocations D in which lattice misfits between atoms are generated are formed at a high density in the grains and at interfaces 202. When the thermoelectric material is manufactured in this way, electrons may flow smoothly through the interfaces of the topological insulators so as to enhance electrical conductivity. Also, phonons P may be scattered by fine grains and dislocations D present inside the grains and at the grain boundaries, so as to improve a figure of merit (ZT) of the thermoelectric material.

In order to form a composite having such characteristics, according to one embodiment of the present disclosure, there is provided a thermoelectric material having a composition represented by Chemical Formula 1 by phase-separation of different types of thermoelectric materials or topological insulators (second materials) within a base material (first materials) of a thermoelectric material Bi0.5Sb1.5Te3 to express interface topology preservation.

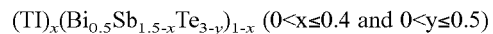

$(TI)_x(Bi_{0.5}Sb_{1.5-x}Te_{3-y})_{1-x}$ (0<x≤0.4 and 0<y≤0.5)

In Chemical Formula 1, TI denotes a "topology insulator", that is, an arbitrary material having topological insulator characteristics, and may thus include at least one of $AgSbTe_2$ and $Ag_2Te$. X denotes a molar ratio of the TI.

The thermoelectric material of the present disclosure may be a P-type thermoelectric semiconductor. That is, the thermoelectric semiconductor may be a semiconductor in which holes act as majority carriers.

In addition, by forming an intermediate using a metal additive as one of materials constituting the thermoelectric material, and melting it during sintering, dislocations D in which lattice misfits between atoms are generated may be formed at a high density inside the grains and at the interfaces 202.

According to one embodiment of the present disclosure, the Te may be stoichiometrically deficient.

According to one embodiment of the present disclosure, Sb may be stoichiometrically deficient.

According to one embodiment of the present disclosure, a compound made of the composition of Chemical Formula 1 may have a dual-phase structure in which a topological insulator TI and $Bi_{0.5}Sb_{1.5}Te_3$ are mixed together, as measured by x-ray diffraction (XRD).

According to one embodiment of the present disclosure, the thermoelectric material may preferably have a density corresponding to 70% to 100% of a theoretical density.

Hereinafter, a manufacturing method for realizing the microstructure of FIG. 2 will be briefly described.

First, an ingot raw material produced with the composition of Chemical formula 1 is rapidly cooled through a rapid solidification process to be prepared into a material (intermediate) in the form of a ribbon.

Next, the intermediate in the form of the ribbon is sintered by spark plasma sintering (SPS) or extrusion-sintering to make a bulk material, thereby preparing fine grains in which topological insulators are formed.

At this time, upon producing the material in the form of the ribbon as the intermediate, when a bulk material is made by adding a metal additive having a low melting temperature, dislocations D, in which lattice misfits between atoms are generated, are formed at a high density in the grains and at the interfaces. That is, the dislocations D are formed not only at the interfaces 202 of the thermoelectric material but also inside the grains.

When the thermoelectric material is manufactured in this way, electrons may flow smoothly through the interface of the topological insulator so as to enhance electrical conductivity. Also, phonons may be scattered by the grains and the dislocations D present inside the grains and at the interfaces, so as to improve a figure of merit (ZT) of the thermoelectric material.

Here, as a metal additive for forming the dislocations D, a predetermined amount (0 to 30 wt %) of tellurium (Te) having a lower melting temperature than that of the ingot raw material is added. The metal additive is discharged to the outside during a sintering process for producing a bulk and confuses an atomic arrangement inside the thermoelectric material, thereby forming lattice misfits within the atomic arrangement. The metal additive may be any one material selected from thermoelectric material raw materials.

Figure 4:
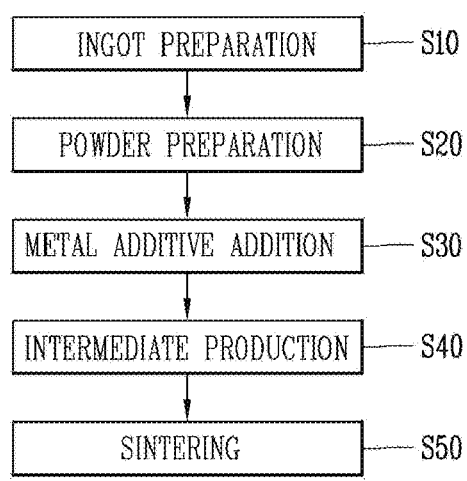
FIG. 4 is a flowchart illustrating a method for preparing a thermoelectric material in accordance with one embodiment.

FIG. 4 is a flowchart illustrating a method for manufacturing a thermoelectric material in accordance with one embodiment.

Hereinafter, a method for manufacturing a thermoelectric material according to one embodiment of the present disclosure will be described in detail with reference to FIG. 4.

In order to manufacture (prepare) the aforementioned thermoelectric material, first, a bulk thermoelectric material (e.g., ingot) is prepared using thermoelectric material raw materials (S10). In this case, the raw materials may include Cu, I, Bi, Sb, and Te.

First, the raw materials are weighted at molar ratios according to a composition of the thermoelectric material. The raw materials are then charged into a quartz tube and sealed in a vacuum state.

After that, the raw materials are charged into a melting furnace and melted at a high temperature of about 1,000° C., and then cooled down to room temperature to prepare an ingot.

The prepared bulk thermoelectric material (ingot) is pulverized and prepared in a powder form (S20). For example, the ingot may be made into a powder form by a ball milling process.

A predetermined amount of metal additive is added to the material (S30). The metal additive may be at least one material selected from thermoelectric material raw materials. In addition, the metal additive may be a material having a lower melting point than that of the ingot.

However, when producing the intermediate to be described below, the metal additive may be a material capable of forming dislocations D inside the lattice or at the interfaces. For example, if the metal additive has the melting point which is low enough to melt before forming a solid crystal, the dislocations D cannot be formed inside the lattice or at the interfaces.

The metal additive may be contained in an amount which is greater than 20% to smaller than 25% by weight of the raw material. In addition, the metal additive may be tellurium (Te).

In the state in which the powder and the metal additive are mixed with each other, an intermediate is produced by using a melting and rapid cooling device (S40). This intermediate may be a material in the form of a ribbon. The intermediate may be produced in the form in which the metal additive is dispersed in the thermoelectric material (the matrix compound).

In the rapid cooling process, the material is charged into a quartz tube having a narrow nozzle size, melted by induction heating, and then instantaneously discharged to a copper rotating plate, which is rotating at high speed, by applying gas pressure, thereby forming particles in the form of the ribbon.

That is, the process of forming the intermediate may include processes of charging the thermoelectric material powder and the metal additive into a tube having a nozzle, melting the thermoelectric material powder and the metal additive into a liquid state, and forming particles in the form of ribbons by discharging the molten material to a rotating plate.

Thereafter, this intermediate is sintered to prepare a thermoelectric material (S50). According to an embodiment of the present disclosure, the sintering of the intermediate may be carried out by selectively applying spark plasma sintering (SPS) or extrusion-sintering. At this time, a sintering temperature may be set to a temperature which is higher than or equal to the melting point of the metal additive.

Figure 14:
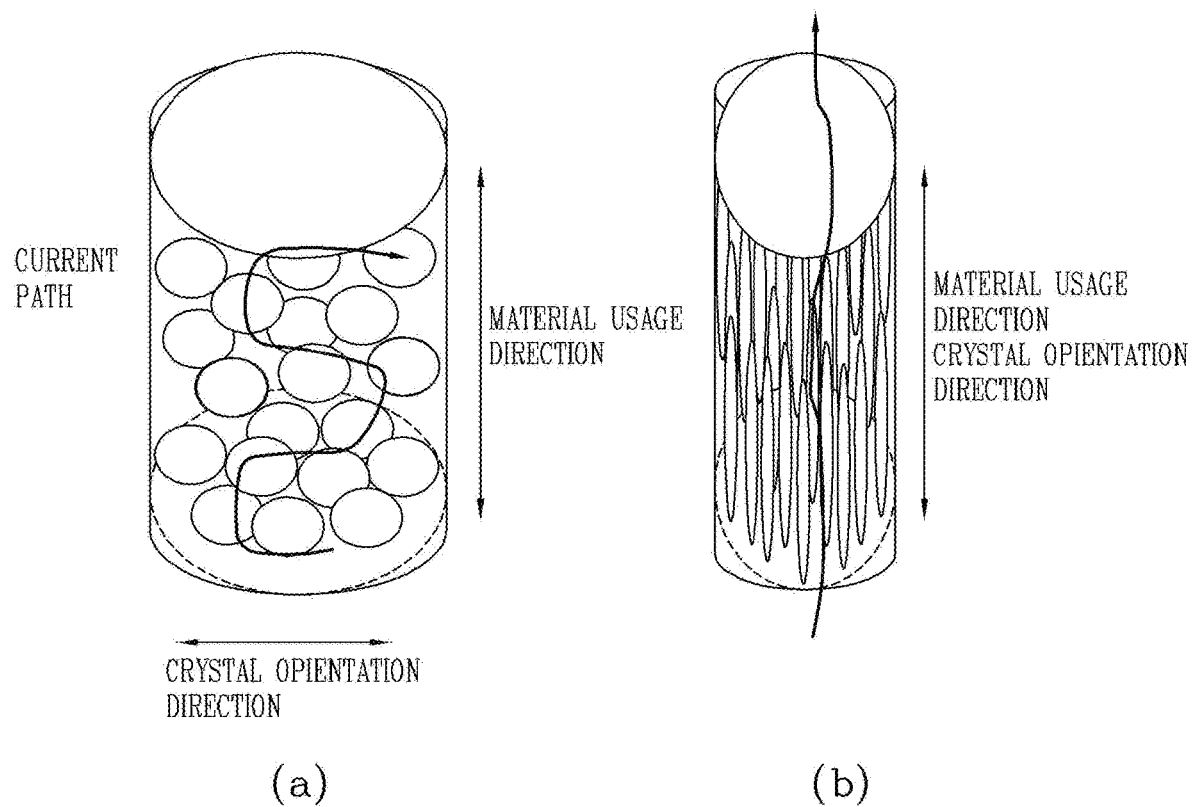
FIG. 14 is a diagram illustrating crystal orientation directions of thermoelectric materials each prepared through a sintering step in accordance with an embodiment.
Figure 15:
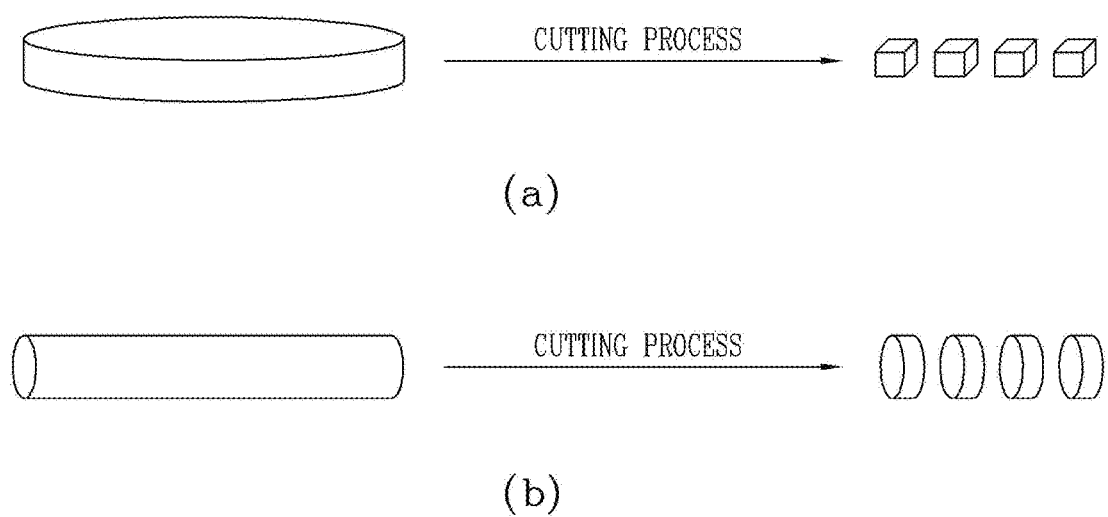
FIG. 15 is a diagram illustrating a shape of a sintered body prepared through a sintering step and a shape of a material after a cutting step, in accordance with an embodiment.

FIG. 14 is a diagram illustrating crystal orientation directions of thermoelectric materials prepared by respective sintering methods in accordance with an embodiment, and FIG. 15 is a view illustrating shapes of sintered bodies prepared through respective sintering steps and shapes of materials after respective cutting steps, in accordance with an embodiment. Specifically, (a) of FIG. 14 and (a) of FIG. 15 illustrate a case by the spark plasma sintering, and (b) of FIG. 14 and (b) of FIG. 15 illustrate a case by the extrusion-sintering.

In one embodiment, the material in the form of the ribbon may be prepared as a bulk-type thermoelectric material by the spark plasma sintering using a carbon mold. In this case, a spark plasma apparatus may be used.

Specifically, in the case of the spark plasma sintering, the ribbon-shaped material is charged into the carbon mold as it is or after being powdered. Afterwards, when a DC current is applied while pressing the charged material, plasma in the form of spark is generated between powder particles constituting the material. At this time, sintering is carried out to instantaneously heat the material to a high temperature and connect the powder particles together.

In this sintering process, the metal additive may be eluted to the outside to form the dislocations. That is, this sintering process may be carried out to elute the metal additive to the outside to form the dislocations.

In another embodiment, the ribbon-shaped material may be prepared as a bulk-type thermoelectric material by the extrusion-sintering.

Specifically, the extrusion-sintering is performed in a manner of putting the ribbon-shaped material (or powder) into a piston and then pressing the piston so that the material passes through a nozzle provided on one side of the piston. The material may be heated at a predetermined temperature for a predetermined time during an extrusion process. Accordingly, a bulk-type thermoelectric material may be prepared.

In this case, an extrusion ratio in the sintering step may preferably be set to at least 5 for uniformity and refinement of the thermoelectric material particles, and the sintering may be performed under a pressure condition of 5 to 20 MPa. In addition, it may be carried out under a temperature condition of 300° C. to 600° C. The sintering step by the extrusion-sintering may be performed for several seconds to several tens of minutes under such pressure and temperature conditions. However, the pressure condition may slightly vary depending on a structure of process equipment or the like.

In general, thermoelectric materials made in a polycrystalline form are prepared by producing an ingot, and preparing the ingot into powders having a size of several to several tens of microns by a ball milling process, followed by a hot-pressing process. However, since a cooling rate is slow when using this general process, there is a limit to reducing a grain size of a bulk material. This may cause electrical conductivity and thermal conductivity to be simultaneously increased, thereby having a limit to increasing thermoelastic performance.

On the other hand, in the case of the extrusion-sintering, it is carried out by a small-area continuous process. This process is advantageous in terms of the number of cuts, compared to the spark plasma sintering, in the step of cutting a sintered body, and accordingly, may enhance mass productivity of product by reducing a tack time. In addition, as shown in FIG. 15, it is possible to minimize a portion wasted when cutting the sintered body, so there is an advantage in terms of cost reduction of the material.

Hereinafter, detailed embodiments of the present disclosure will be described in detail.

1. Production of Ingot

Figure 5:
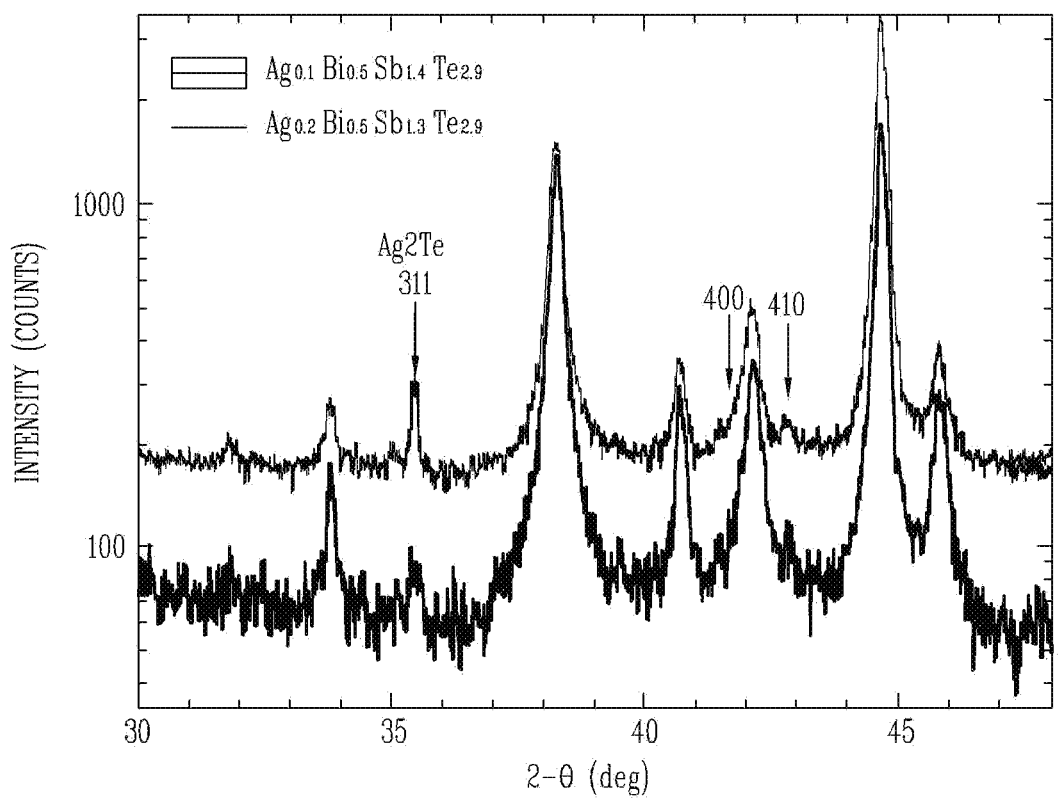
FIG. 5 is a view illustrating an X-ray diffraction (XRD) measurement spectrum of a bulk thermoelectric material according to one embodiment of the present disclosure.

FIG. 5 is a diagram illustrating an X-ray diffraction (XRD) measurement spectrum of a bulk thermoelectric material according to one embodiment of the present disclosure. Also, FIG. 6 is a high-resolution Transmission Electron Microscopic (TEM) image of a bulk thermoelectric material according to one embodiment of the present disclosure.

To prepare a bulk thermoelectric material, first, Ag, Bi, Sb, and Te are quantitatively measured at molar ratios according to a composition ratio of $Ag_{0.2}Bi_{0.5}Sb_{1.4}Te_{2.9}$, put into a quartz tube, and the quartz tube is vacuum-sealed at a pressure of $10^{-5}$ torr.

Since $Ag_2Te$ has a melting point of 960° C., the vacuum-sealed quartz tube is put into an electric furnace, gradually heated to a temperature of 1,050° C., maintained at 1,050° C. for 12 hours, and then cooled.

Figure 6:
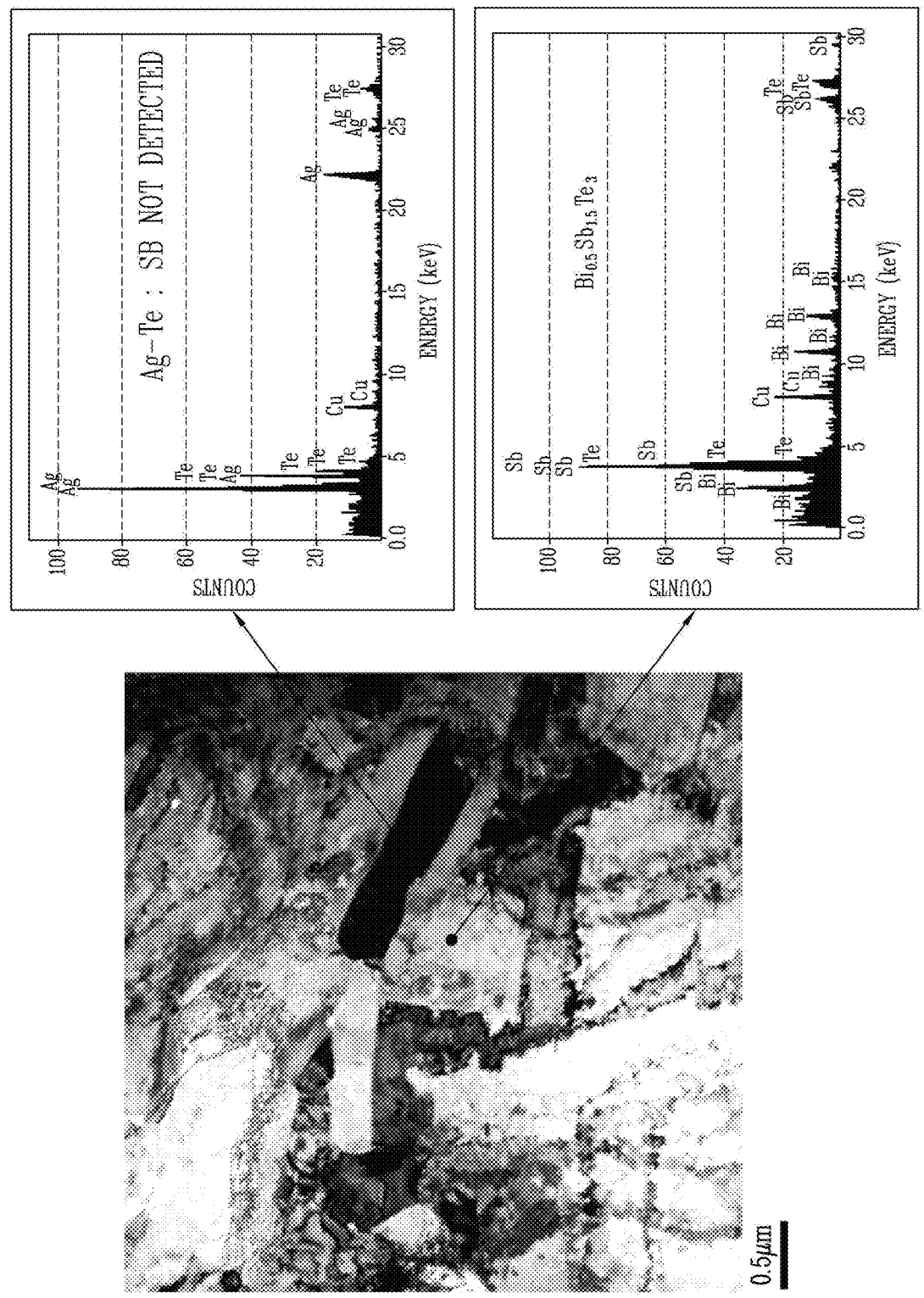
FIG. 6 is a high-resolution Transmission Electron Microscopic (TEM) image of a bulk thermoelectric material according to one embodiment of the present disclosure.

An observation result of a microstructure of the bulk thermoelectric material (ingot material) made through the process is shown in FIG. 6.

FIG. 5 illustrates X-ray diffraction (XRD) measurement results of an $Ag_2Te$ phase phase-separated from $Bi_{0.5}Sb_{1.5}Te_3$, and FIG. 6 illustrates high-resolution transmission electron microscope (TEM) results of the $Ag_2Te$ phase phase-separated from $Bi_{0.5}Sb_{1.5}Te_3$.

As illustrated in FIGS. 5 and 6, it can be seen that $AgSbTe_2$ and $Bi_{0.5}Sb_{1.5}Te_3$ phases of the ingot material were separated.

1. Preparation of Bulk Thermoelectric Material

Figure 7:
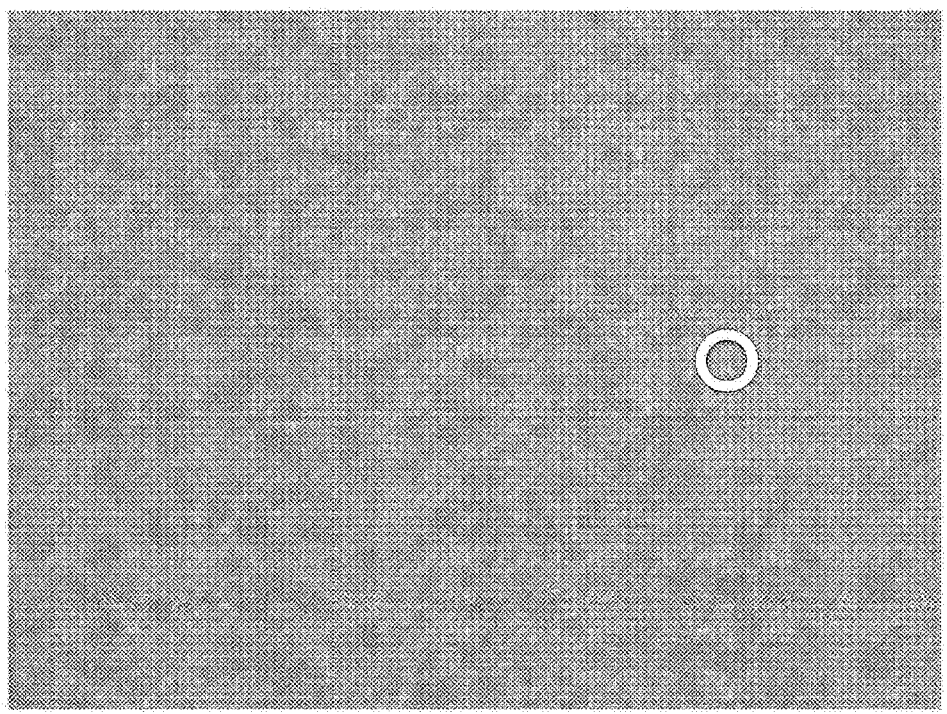
FIG. 7 is a Scanning Electron Microscopic (SEM) image of an intermediate according to one embodiment of the present disclosure.
Figure 8:
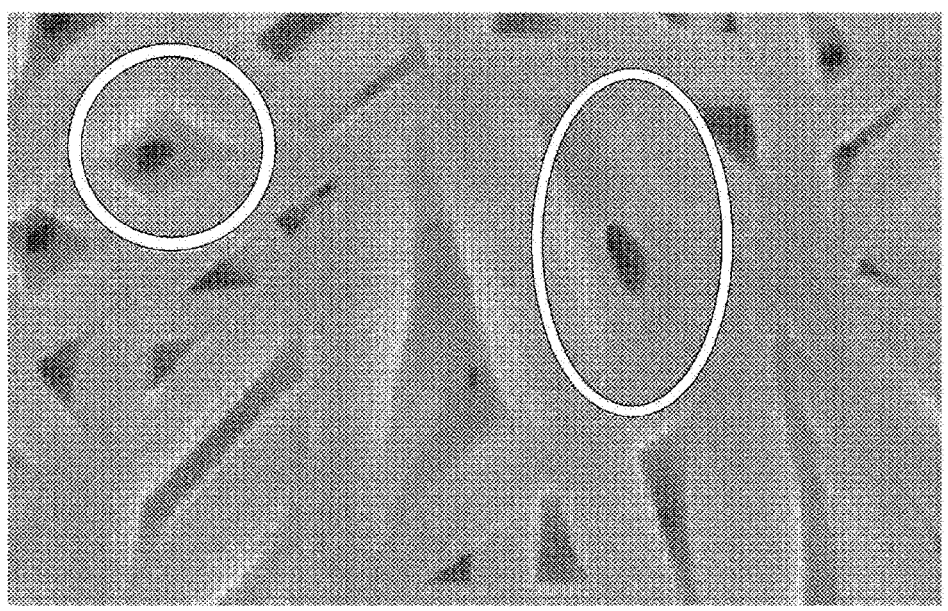
FIG. 8 is an enlarged view of a part A in FIG. 7.

FIG. 7 is a Scanning Electron Microscopic (SEM) image of an intermediate according to one embodiment of the present disclosure. Also, FIG. 8 is an enlarged view of a part A in FIG. 7.

The ingot material produced with the composition of Ag0.2Bi0.5Sb1.4Te2.9 is produced into powder having a size of several to several tens of microns through a milling process.

Then, 20 to 25% by weight of tellurium (Te) powder as a metal additive is mixed with the matrix composition powder, to form an intermediate using a rapid cooling device.

That is, in order to form a ribbon using the rapid cooling device, the mixture is made into pellets with a diameter of 10 to 15 mm and a height of mm or more, and then put into a quartz tube having a nozzle size of about 0.3 to 0.4 mm in diameter.

Thereafter, the powder is melted by induction heating and then cooled and solidified by discharging it to a copper rotating plate, which has a diameter of 300 mm and rotates at high speed, by applying pressure, thereby producing an intermediate in the form of the ribbon in which the metal additive is eluted. That is, the metal additive may be distributed in the form of nanoparticles.

At this time, when the rotating plate rotates at 2800 to 3200 rpm, a ribbon-shaped material having a thickness of about 1 μm to 100 μm is obtained. The ribbon-shaped material is obtained in a shape that the metal additive is dispersed in the form of nanoparticles in the thermoelectric material. The thermoelectric material and the metal additive may then be formed to have sizes in the range of several tens to several hundreds of nanometers nm by virtue of the effect of the rapid cooling.

For example, when a ribbon-shaped material is made using a rapid cooling device by adding a Te as a metal additive to a material of $Ag_{0.2}Bi_{0.5}Sb_{1.4}Te_{2.9}$ as a thermoelectric matrix, the ribbon shape may have a surface as illustrated in FIGS. 7 and 8.

When a metal additive, for example, Te is added in an excessive amount to the melt of $Ag_{0.2}Bi_{0.5}Sb_{1.4}Te_{2.9}$, eutectic decomposition occurs during a crystallization process and the Te is eluted. Part B of FIG. 8 shows a state in which the Te is eluted by the eutectic decomposition.

At this time, locations where the Te is eluted are uniformly dispersed in the grains, and as shown in FIGS. 7 and 8, Te particles may appear in a shape like being sandwiched on the dendritic surface. As described above, this may be a good condition for increasing the $Bi_{0.5}Sb_{1.5}Te_3$/Te interface density including misfit dislocations at a high density.

2. Sintering

Figure 9:
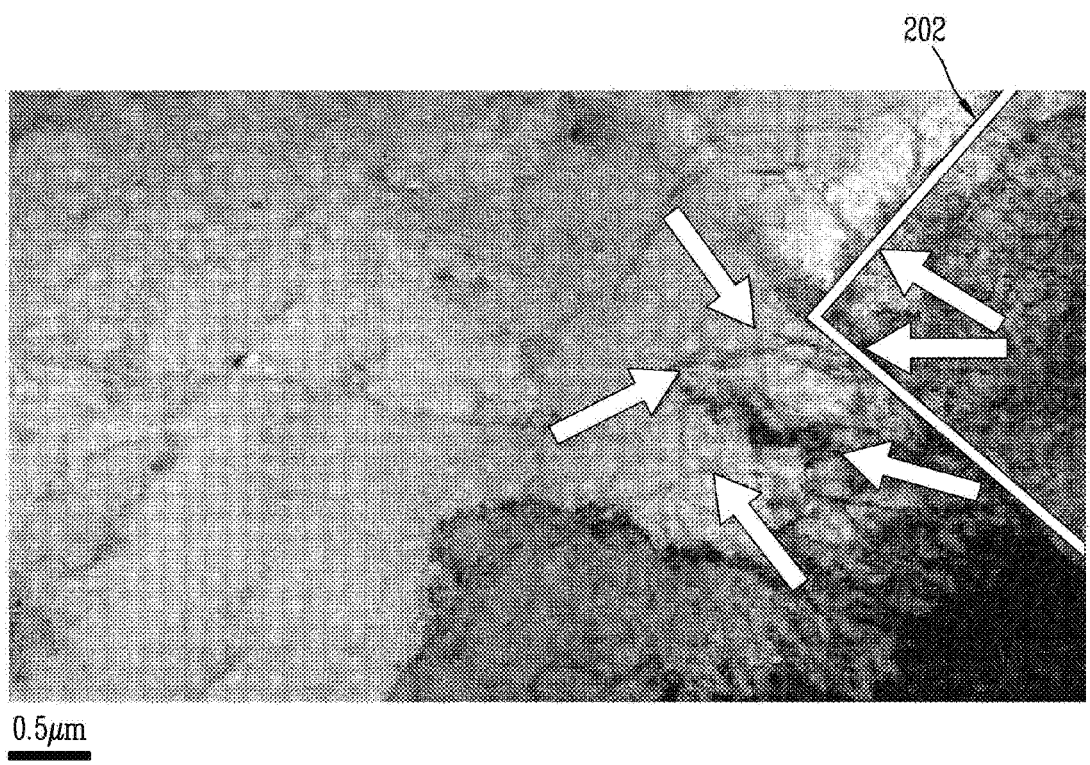
FIG. 9 is a high-resolution Transmission Electron Microscopic (TEM) image of a thermoelectric material prepared by sintering, in accordance with one embodiment of the present disclosure.

FIG. 9 is a high-resolution Transmission Electron Microscopic (TEM) image of a thermoelectric material prepared by sintering, in accordance with one embodiment of the present disclosure.

As described above, the ribbon-shaped intermediate which was made through the rapid solidification method using the rapid cooling device is pulverized, and then subjected to press-sintering using the spark plasma sintering or the extrusion-sintering.

In the press-sintering, the material is charged into a carbon mold having an inner diameter of 10 mm, maintained at a temperature of 450 to 500° C. for 3 minutes, and then air-cooled. At this time, the thickness of a sample used is 10 mm.

During the press-sintering, a sintering temperature may be higher than the melting point of tellurium, as the metal additive, in order for the thermoelectric matrix, $Bi_{0.5}Sb_{1.5}Te_3$/Te to have a semicoherent interface.

For example, the sintering temperature may be a temperature higher than or equal to the melting point of the metal additive, for example, a temperature in a range of the melting point to a temperature higher than the melting point by 30° C. or more.

The melting point of the tellurium at normal pressure is 449.57° C., and is slightly lowered depending on pressure applied. It may be understood that after the tellurium is changed to a liquid phase, crystallization should start according to a crystal face of $Bi_{0.5}Sb_{1.5}Te_3$.

The tellurium may be eluted in a specific amount to the outside during the press-sintering because the tellurium is in the liquid phase, pressure applied in the press-sintering process may be about 30 MPa or higher, for example, in the range of 40 to 100 MPa for the spark plasma sintering, and may be in the range of 5 to 20 MPa for the exclusion-sintering. The pressure difference may differ depending on the structure of process equipment.

As a result of observing the microstructure of the bulk thermoelectric material manufactured by the spark plasma sintering through TEM, it can be seen that dislocations are observed not only at the interfaces 202 of the grains but also inside the grains as shown in FIG. 9. In FIG. 9, arrows indicate the positions of the dislocations.

1. Characteristic Evaluation Results

FIGS. 10 to 13 are graphs showing characteristics for temperatures of a thermoelectric material prepared according to an embodiment of the present disclosure.

Specifically, FIGS. 10 to 13 compare characteristic values (denoted by dotted lines and squares) of the sample prepared by using $Bi_{0.5}Sb_{1.5}Te_3$ with a stoichiometric composition according to the related art with characteristic values (denoted by solid lines and triangles) of the thermoelectric material prepared according to the embodiment of the present disclosure.

FIGS. 10 to 13 illustrate the figure of merit ZT, the electrical conductivity, the Seebeck coefficient, and the thermal conductivity, respectively.

Electrical conductivity and Seebeck coefficient were simultaneously measured using ULVAC ZEM-3, and thermal conductivity was calculated from thermal diffusivity measured by ULVAC TC-9000H (Laser Flash method).

Examining the thermoelectric ZT and each characteristic value calculated from those results, it seems that there is little change in Seebeck coefficient (FIG. 12) at 50° C.

However, the electrical conductivity (FIG. 11) greatly increased from 0.40 to 0.74 at 50° C., and at this time, the thermal conductivity (FIG. 13) decreased from 0.93 to 0.84.

Figure 10:
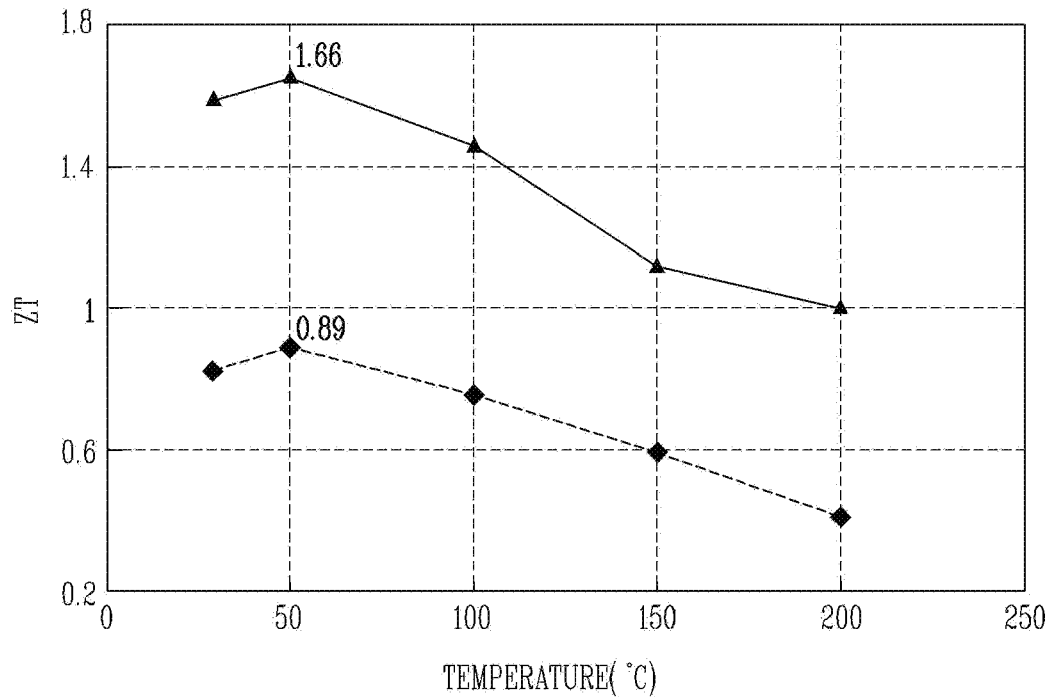
FIGS. 10 to 13 are graphs showing characteristics for temperatures of a thermoelectric material prepared according to one embodiment of the present disclosure.
Figure 11:
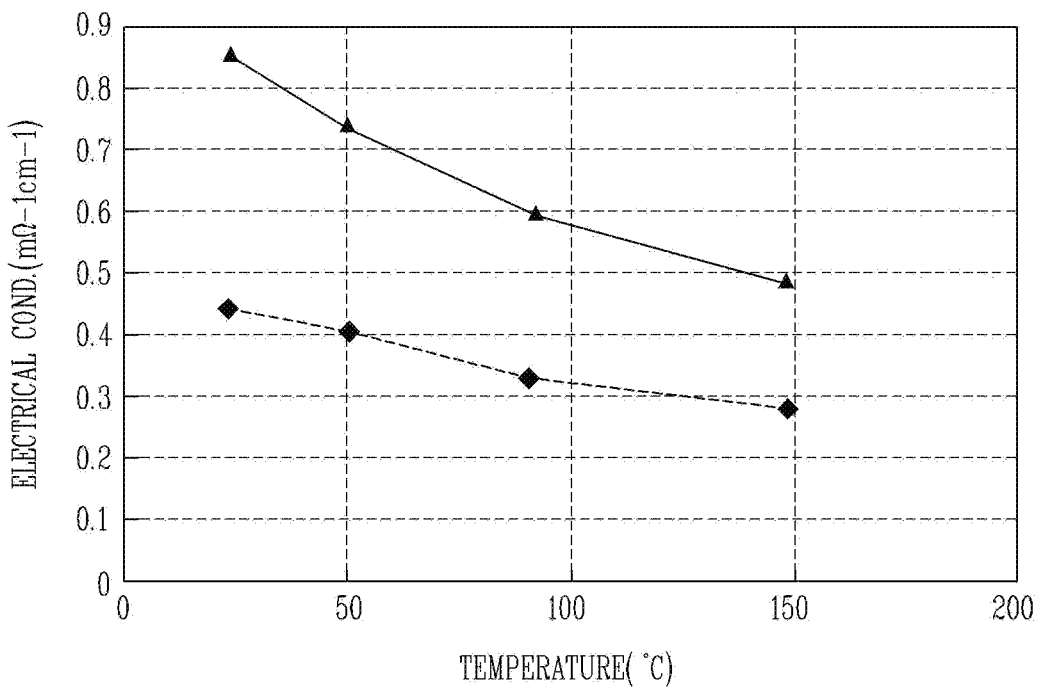
Figure 12:
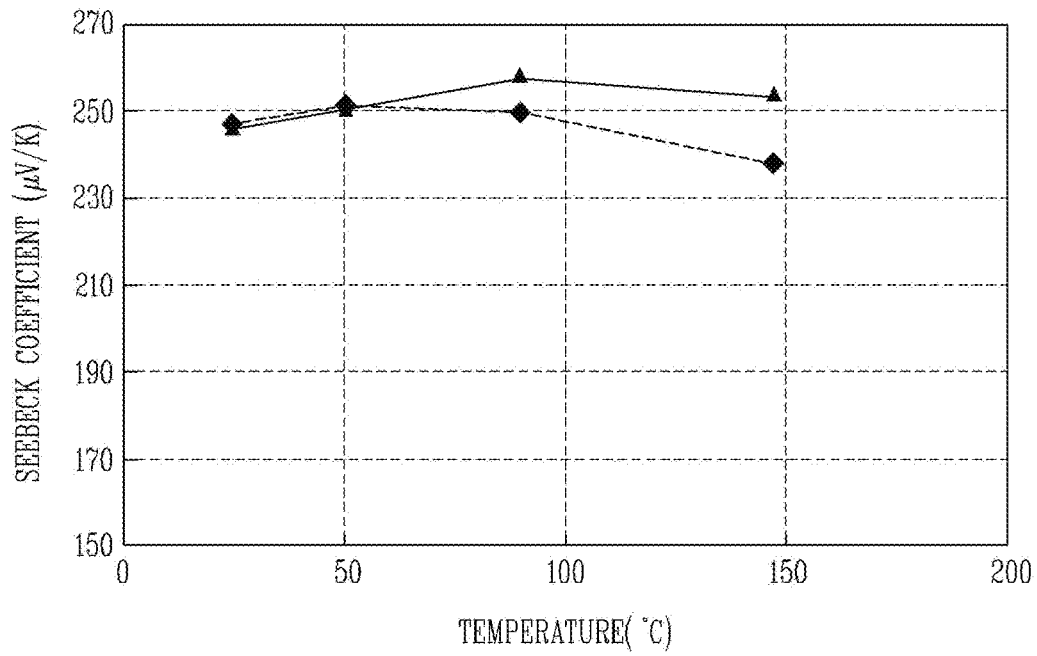
Figure 13:
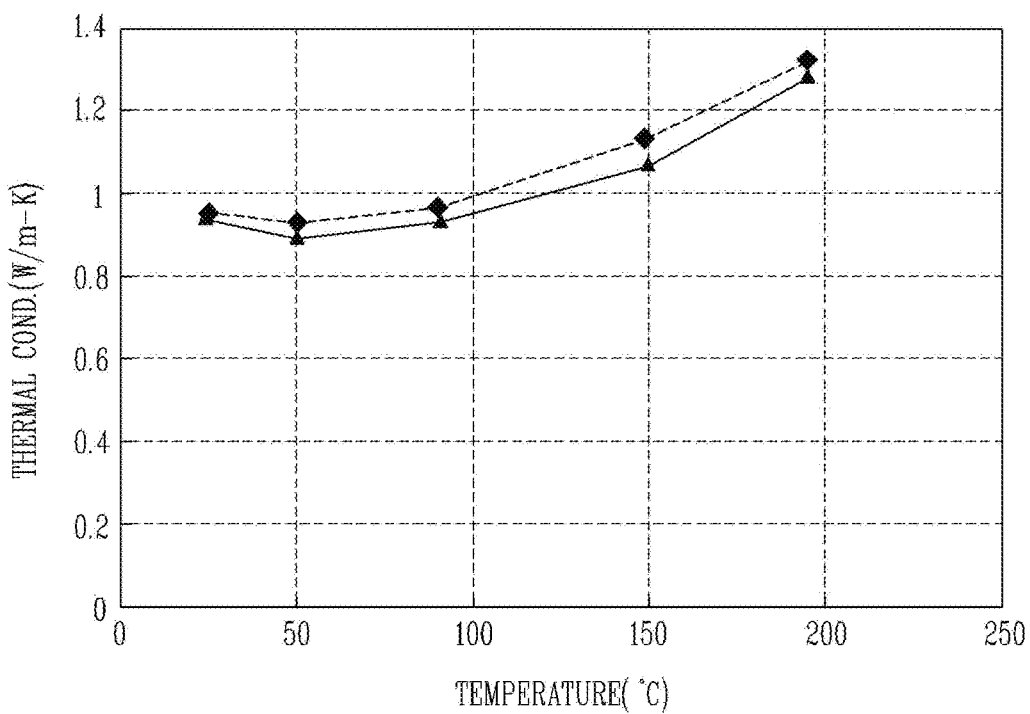

Therefore, referring to FIG. 10, the ZT of the thermoelectric material was greatly improved from 0.9 to 1.6.

According to the observation results of the microstructures, compared to the related art, an average grain size was reduced from 20 microns to 7 microns, and phonons were scattered by the dislocations formed in the grains and at the interfaces, so as to lower the thermal conductivity. Also, the $Ag_2Te$ phase and the $Bi_{0.5}Sb_{1.5}Te_3$ matrix crystal interface became conductors due to a phase interface effect to allow a smooth flow of electrons so as to improve the electrical conductivity. This results in enhancement of the thermoelectric performance.

Hereinafter, thermoelectric materials prepared by the spark plasma sintering and the extrusion-sintering according to embodiments of the present disclosure will be compared to each other with reference to FIGS. 16 and 17.

Figure 16:
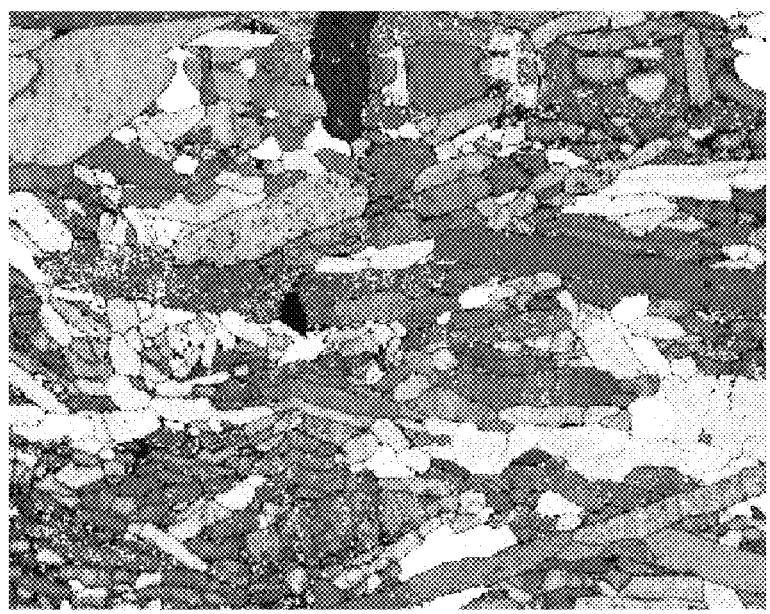
FIG. 16 is a diagram illustrating EBSD images of a microstructure of a thermoelectric material prepared through a sintering step in accordance with an embodiment.
Figure 16:
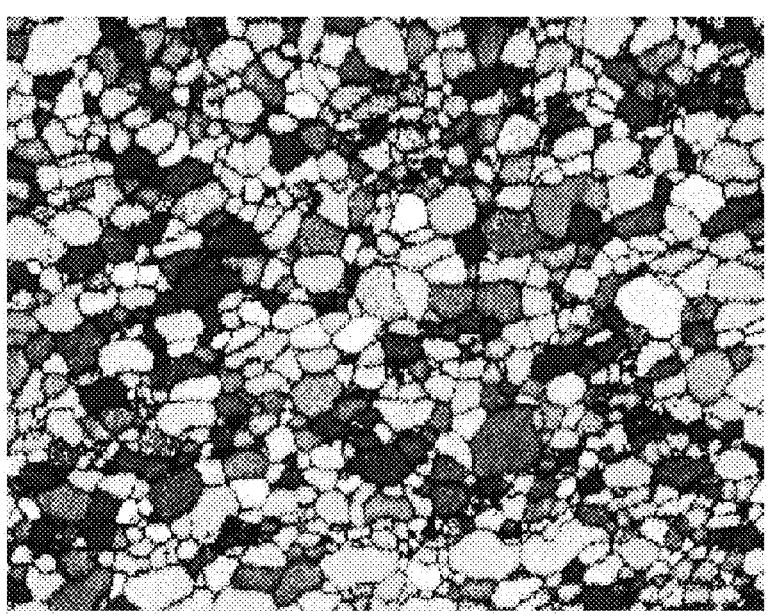
Figure 17:
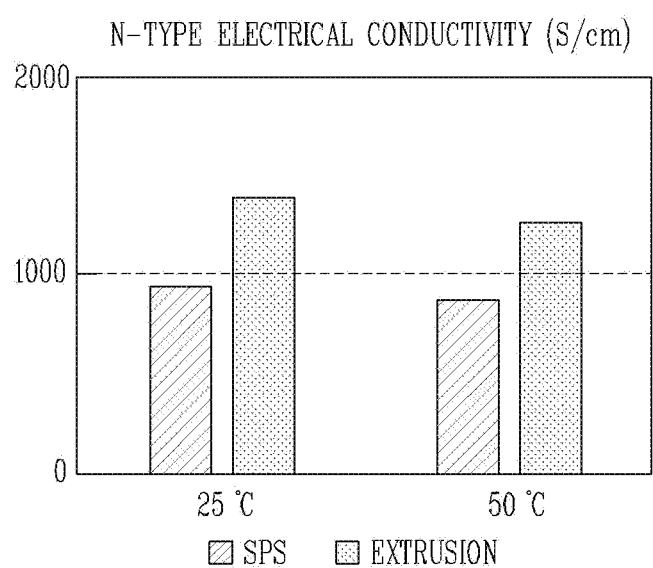
FIG. 17 is a graph showing electric conductivity characteristics for temperatures of p-type thermoelectric materials prepared through respective sintering steps in accordance with an embodiment of the present disclosure.

FIG. 16 is a view illustrating EBSD images of a microstructure of a thermoelectric material prepared through a sintering step in accordance with an embodiment, and FIG. 17 is a graph showing electric conductivity characteristics relative to a temperature of an n-type thermoelectric material prepared through a sintering step in accordance with an embodiment. Specifically, (a) of FIG. 16 illustrates a case by the spark plasma sintering, and (b) of FIG. 16 illustrates a case by the extrusion-sintering.

Referring to FIG. 16, it can be confirmed that the thermoelectric material prepared through the extrusion-sintering ((b) of FIG. 16), which has an average grain size of 5 to 6 microns, includes particles having finer sizes than the particles included in the thermoelectric material prepared through the spark plasma sintering, which has an average grain size of about 9 microns. That is, a thermoelectric material having a more uniform and finer structure can be prepared through the extrusion-sintering. In this case, the thermoelectric material may exhibit thermoelectric performance improved by the aforementioned carrier filtering effect and phonon scattering effect due to structural characteristics.

In addition, when employing the spark plasma sintering, a sintered area is increased which causes some limitation in uniformly dispersing nanoparticles in a matrix compound. However, when employing the extrusion-sintering, a small-area continuous process is carried out, which may provide an advantage of dispersing nanoparticles relatively uniformly in a matrix compound.

On the other hand, the thermoelectric material prepared through the extrusion-sintering showed superior electrical conductivity, compared to the thermoelectric material prepared by the spark plasma sintering at predetermined temperatures (25° C. and 50° C.) according to FIG. 17. This is because a current path is reduced which results from that a crystal orientation direction defined during the process of extruding the ribbon-shaped material through the nozzle is the same as a material usage direction considered when cutting the thermoelectric material later.

On the contrary, the thermoelectric material prepared by the spark plasma sintering exhibits improved electrical conductivity, compared to a thermoelectric material prepared by the related art hot-pressing method. In spite of this, since the crystal orientation direction of the material defined during the sintering process is different from the direction that the material is used, it affects the current path. As a result, the electrical conductivity of the thermoelectric material cannot be fully utilized. The particle crystal direction and usage direction of the material formed through each sintering process and the current path can all be confirmed in FIG. 14.

On the other hand, the graph of FIG. 17 shows only electrical conductivity measured under temperature conditions of 25° C. and 50° C., but for the aforementioned reasons, it may be obvious that the thermoelectric material prepared by the extrusion-sintering also has superior electrical conductivity, compared to the thermoelectric material prepared by the spark plasma sintering, even in other temperature conditions.

Embodiments of the present disclosure disclosed herein and accompanying drawings are merely illustrative to help understanding, and should not be construed to limit the scope of the present disclosure. It will be apparent to those of ordinary skill in the art to which the present disclosure pertains that other modifications based on the technical idea of the present disclosure can be implemented in addition to the embodiments disclosed herein.

The invention claimed is:

1. A method for manufacturing a thermoelectric material, the method comprising: preparing a bulk thermoelectric material using thermoelectric material raw materials; producing a powder of the bulk thermoelectric material; adding a metal additive selected from the thermoelectric material raw materials to the powder; forming pellets using the powder and the metal additives; forming an intermediate in which the metal additive is dispersed in the bulk thermoelectric material using the pellets; and sintering the intermediate at a temperature higher than or equal to a melting point of the metal additive and under a pressure of equal to or greater than about 5 MPa, and forming the thermoelectric material having an average grain size of about 5 micron or greater and less than 20 micron and forming dislocations both at an inside and at interfaces of grains of the thermoelectric material.

2. The method of claim 1, wherein the bulk thermoelectric material has a composition of Chemical Formula 1, $$(TI)_x(Bi_{0.5}Sb_{1.5-x}Te_{3-y})_{1-x}, \text{ and} \quad \text{<Chemical Formula 1>}$$

wherein TI denotes a topological insulator, and
wherein, in Chemical Formula 1, $0<x\leq 0.4$ and $0<y\leq 0.5$.

3. The method of claim 2, wherein the bulk thermoelectric material has a dual-phase structure including a first grain composed of the $Bi_{0.5}Sb_{1.5-x}Te_{3-y}$ material and a second grain composed of the topological insulator.

4. The method of claim 2, wherein the topological insulator contains at least one of $AgSbTe_2$ and $Ag_2Te$.

5. The method of claim 1, wherein the thermoelectric material raw materials include Ag, Bi, Sb, and Te.

6. The method of claim 1, wherein the metal additive is tellurium (Te).

7. The method of claim 1, wherein the metal additive is contained in an amount greater than 20% to smaller than 25% by weight of the thermoelectric material raw materials.

8. The method of claim 1, wherein the forming the intermediate is performed using a melting and rapid cooling device.

9. The method of claim 8, wherein the forming the intermediate comprises:
charging the pellets of the powder of the bulk thermoelectric material and the metal additive into a tube having a nozzle;
melting the powder of thermoelectric material and the metal additive in a liquid state; and
discharging the molten material to a rotating plate to form particles in a shape of a ribbon.

10. The method of claim 1, wherein the sintering is performed using spark plasma sintering.

11. The method of claim 7, wherein the sintering is performed using extrusion-sintering.

12. The method of claim 11, wherein the extrusion-sintering is performed under the pressure of about 5 to 20 MPa.

13. The method of claim 12, wherein the temperature is about 300° C. to 600° C.

14. The method of claim 10, wherein the spark plasma sintering is performed under pressure of about 40 to 100 MPa.

15. The method of claim 1, wherein the pellets have a diameter of 10 mm to 14 mm and a height of 10 mm or more.

* * * * *